(12) United States Patent
Thiel et al.

(10) Patent No.: US 6,386,790 B1
(45) Date of Patent: May 14, 2002

(54) ONE-PIECE STAINLESS STEEL RIM FOR MATING A METER COVER AND BASE AND METHOD OF MAKING SAME

(75) Inventors: Patrick L. Thiel, Raleigh; Jimmy L. Watson, Wendell; Roger D. Stephenson, Raleigh, all of NC (US)

(73) Assignee: ABB Automation Inc., Wickliffe, OH (US)

( * ) Notice: Subject to any disclaimer, the term of this patent is extended or adjusted under 35 U.S.C. 154(b) by 0 days.

(21) Appl. No.: 09/625,773

(22) Filed: Jul. 26, 2000

(51) Int. Cl.[7] .................................................. H02B 9/00
(52) U.S. Cl. ...................... 403/335; 403/336; 361/664; 292/256.67; 439/517
(58) Field of Search .................................. 403/335, 336, 403/338, 281; 361/664, 667; 174/17 CT; 324/156; 439/517; 220/3.8; 292/256.67, 256.6; 285/407; 24/20 R, 20 EE, 20 W, 20 CW, 20 TT

(56) References Cited

U.S. PATENT DOCUMENTS

| | | | |
|---|---|---|---|
| 1,969,499 A | * 8/1934 | Bradshaw et al. | .......... 324/156 |
| 3,628,096 A | 12/1971 | Drew, Jr. | .................... 317/107 |
| 3,683,102 A | 8/1972 | Moran et al. | ................... 174/50 |
| 3,943,441 A | * 3/1976 | Shackford | ................ 324/156 X |
| 4,121,147 A | 10/1978 | Becker et al. | ............... 324/104 |
| 4,146,258 A | 3/1979 | Andruchiw | ............... 292/256.6 |
| 4,747,016 A | 5/1988 | Sloop, Sr. | ..................... 361/364 |
| 5,048,881 A | 9/1991 | Renfro | ........................ 292/320 |
| 5,088,004 A | 2/1992 | Howell | ......................... 361/373 |
| 5,205,280 A | * 4/1993 | Dennison, Jr. et al. | ......... 128/3 |
| 5,364,290 A | * 11/1994 | Hartman | ...................... 439/517 |
| 5,385,486 A | 1/1995 | Robinson et al. | ............ 439/517 |
| 5,473,504 A | 12/1995 | Horan et al. | ................. 361/667 |
| 5,499,159 A | 3/1996 | Gatz | ............................ 361/667 |
| 5,704,804 A | 1/1998 | Robinson et al. | ............ 439/517 |
| 5,959,243 A | 9/1999 | Thiel | ...................... 174/17 CT |

FOREIGN PATENT DOCUMENTS

GB           2745   * of 1886   ............... 24/20 EE

* cited by examiner

Primary Examiner—Lynne H. Browne
Assistant Examiner—John R. Cottingham
(74) Attorney, Agent, or Firm—Woodcock Washburn, LLP

(57) ABSTRACT

A one-piece stainless steel rim for mating a meter cover and base and method of making the same is disclosed. The stainless steel mating rim has integral therewith the various attachment tabs, locking lugs and locking tabs for attaching the rim to the cover, locking the rim to the base and insuring a proper fit of the rim with the cover.

6 Claims, 5 Drawing Sheets

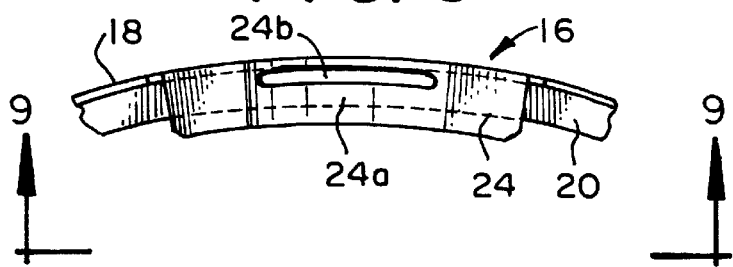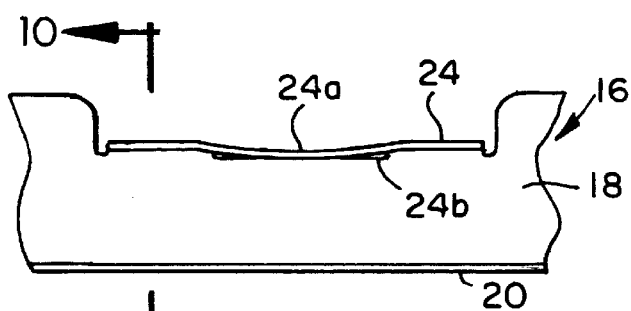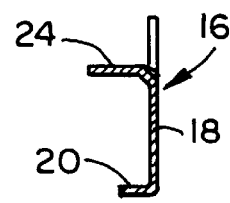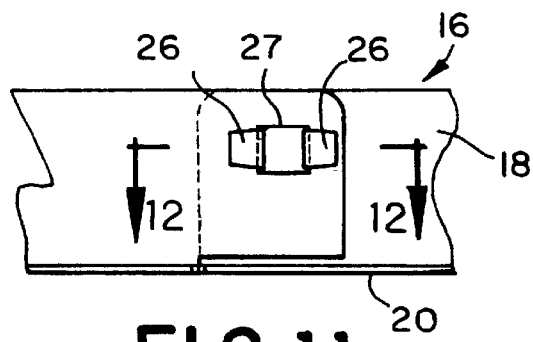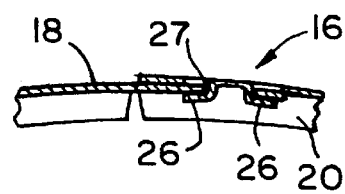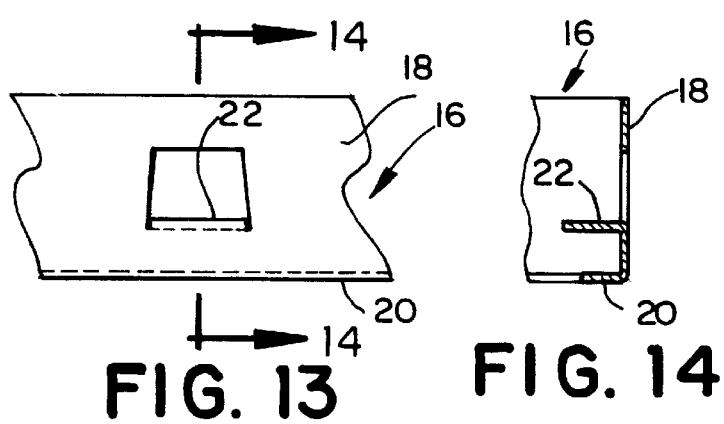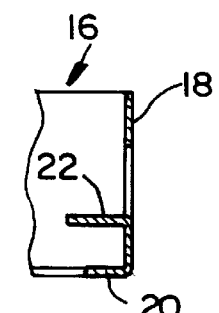

ONE-PIECE STAINLESS STEEL RIM FOR MATING A METER COVER AND BASE AND METHOD OF MAKING SAME

BACKGROUND OF THE INVENTION

1. Field of the Invention

This invention relates to a one-piece stainless steel rim for mating a meter cover and base for an electric meter and particularly to a method of making the rim and attaching it to the cover. The invention is particularly suitable for an electric induction watthour meter.

2. Description of the Prior Art

For many years, a stainless steel rim has been used to attach to the molded glass cover to the base of a single phase watthour meter. The circular flanged rim is assembled to the cover by welding clips onto the rim. During the welding process, the cover which is part of the assembly, is prone to breakage due to forces applied to the metal parts to keep them on location and heat generated during welding. Large variations in the dimensions of the molded cover also aggravate the assembly process causing non-uniform loading to be applied to the glass that may cause injury to a person during assembly. Metal rims, being made from thin coil stock, have sharp edges which can cause injury to a person when assembling the cover onto the base or the insertion of the complete meter into the socket. Upon insulation of the meter in the field, the installer takes the meter and inserts it into a socket and then places a "U-shaped" sealing ring around the perimeter of the cover flange, rim and base. To make sure that the sealing ring fits over the assembly, the diameter and height build up of the meter, rim and base are dimensioned to meet specific ANSI-limits. The sealing ring also has ANSI-values limiting its size. Any change in the design of the rim, cover or base may adversely impact the fit of the sealing ring over the assembly. It has heretofore been proposed to replace metal rims with a plastic mating ring for mounting a meter cover to a meter base. Examples of such plastic mating rings are disclosed in U.S. Pat. No. 5,499,159 and U.S. Pat. No. 5,959,243. While such plastic rings have been successful, nevertheless they have left something to be desired. Since plastic mating rims are endless rings, their circumference must be closely controlled with respect to the circumference of the meter cover and the diameter must not exceed ANSI limits. Also, plastic tends to deteriorate with time and under adverse conditions. Plastic rims must be of sufficient strength that they will not broken in normal handling. Also the plastic rims should not be deflexible so that they can be pulled off the cover or the rim be pulled off of the base when the meter is being removed from the socket by the meter installer. The design of the rim whether metal or plastic must be adequate to compensate for the variation in the stack build up of the cover, base and gasket to provide both for the sealing of the gasket and limiting the torque required to turn the rim-cover assembly onto the base.

It would be desirable to reduce the complexity of the assembly of the mating rim with a meter cover and base by making the rim from a single strip of stainless steel sheet metal. It would also be desirable to form the various features of the rim from the rim material and thus reduce the cost associated with the manufacture of the part and the assembly of the rim onto the cover. It would also be desirable to construct the rim so that no additional components are required as attachments to the rim to make it a functional assembly and also to eliminate all welding. The basic structural features required in the rim are (1) tabs for interlocking the rim to the cover (2) locking lugs to allow the rim to be tightened onto the base and (3) a means of securely attaching one end of the rim to the other. It would be desirable for these structural features to be punched out from the rim itself and thus an integral part of it. All of these structural elements are bent radially inward from punched and lanced sections in the rim. Since all of the elements are die punched and bent sections, a high degree of dimensional accuracy is maintained between elements. All of the elements on the periphery of the rim are precisely located relative one to the other. When the rim is attached to the cover, the overall length of the rim controls the diameter of the rim. Variations in the diameter of the rim are greatly minimized and the fit between the rim and the cover is closely controlled. A simple process of upsetting the locking tabs is only required for completing the attachment. No welding is required.

SUMMARY OF THE INVENTION

It is an object of the present invention to provide a one-piece stainless steel rim in which all of the tabs for interlocking the rim to the cover and the locking lugs for attachment to the base are formed from the rim itself thereby eliminating the need for any spot welding.

It is a further object of the invention to enable the rim to be assembled onto the glass cover by fitting it over the periphery of the cover flange and making the attachment by upsetting two locking tabs. It is a further object of the invention to construct the locking lugs with flexible sections to control the magnitude of the twisting torque required to rotate the rim-cover assembly onto the base.

In accordance with the present invention there is provided a method of making a one-piece stainless steel rim for mating a meter cover and base. The method comprises the steps of cutting a strip of stainless steel of predetermined width to a predetermined length corresponding to the circumference of the meter cover and forming a flange on one edge of the strip. The method further includes the step of punching a plurality of attachment tabs in the strip at spaced locations, the attachment tabs being spaced apart from the flange to receive therebetween an annular flange on the meter cover. The method further includes the step of punching a plurality of locking lugs in the strip at spaced locations, the locking lugs being spaced apart from the flange to receive therebetween an annular flange on the meter base. The method further includes the step of punching a pair of locking tabs at one end of the strip and punching an opening in the opposite end of the strip to receive the locking tabs. The method further includes the step of bending the plurality of attachment tabs, the plurality of locking lugs and the pair of locking tabs to the same side of the strip as the flange, forming the strip into a circular ring and securing the ends of the rim together by inserting the locking tabs into the opening at the opposite end of the rim and mechanically securing one end of the rim to the other.

Further in accordance with the invention there is provided a one-piece stainless steel rim for mating a meter cover and base comprising a strip of stainless steel of predetermined width cut to a predetermined length corresponding to the circumference of the meter cover, a flange formed on one edge of the strip, a plurality of attachment tabs punched in the strip at spaced locations, the attachment tabs being spaced apart from the flange to receive therebetween an annular flange on the meter cover, a plurality of locking lugs punched in the strip at spaced locations, the locking lugs being spaced apart from the flange to receive therebetween an annular flange on the meter base, a pair of locking tabs punched in the strip at one end thereof, an opening punched in the opposite end of the strip to receive the locking tabs, the plurality of attachment tabs, the plurality of locking lugs and the pair of locking tabs being bent to the same side of the strip as the flange, the strip being formed into a circular rim, and the ends of the rim being secured together by inserting the locking tabs into the opening at the opposite end of the rim.

For more detailed disclosure of the invention and for further objects and advantages thereof, reference is to be had to the following description taken in conjunction with the accompanying drawings.

BRIEF DESCRIPTION OF THE DRAWINGS

FIG. 8 is a plan view on enlarged scale of the bulls eye area in FIG. 6.

FIG. 9 sectional view taken along the lines 9—9 in FIG. 8.

FIG. 10 is a sectional view taken along the lines 10—10 in FIG. 9.

FIG. 11 is a sectional view taken along the lines 11—11 in FIG. 6.

FIG. 12 is a sectional view taken along the lines 12—12 in FIG. 11.

FIG. 13 is a sectional view taken along the lines 13—13 in FIG. 6.

FIG. 14 is a sectional view taken along the lines 14—14 in FIG. 13.

DESCRIPTION OF THE PREFERRED EMBODIMENT

Figure 1:
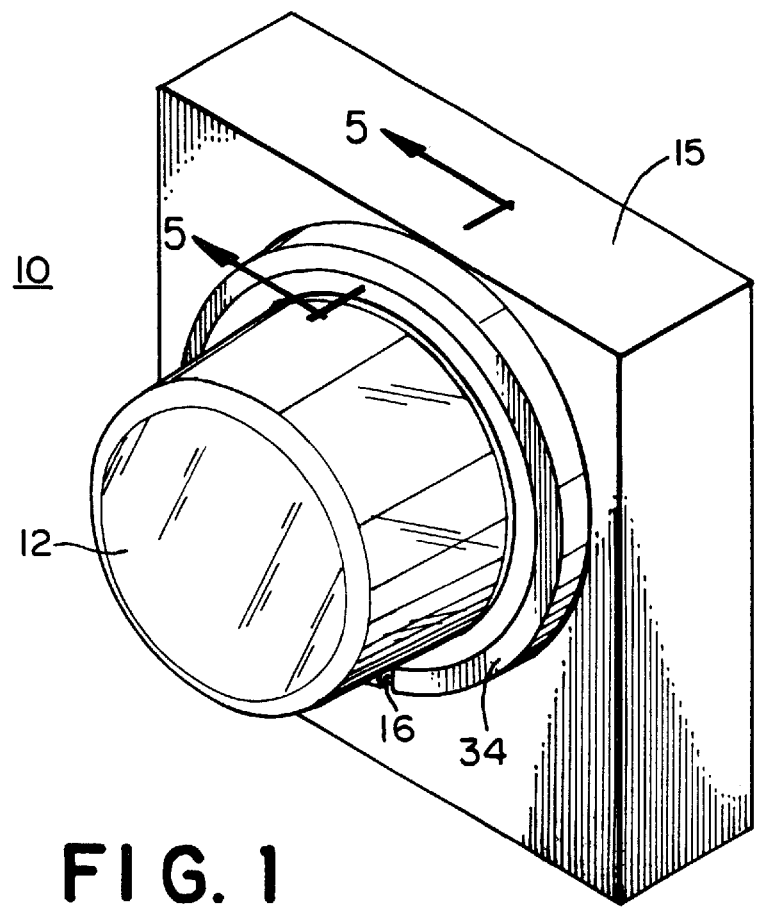
FIG. 1 is a perspective view of an electric meter assembly embodying the present invention.
Figure 5:
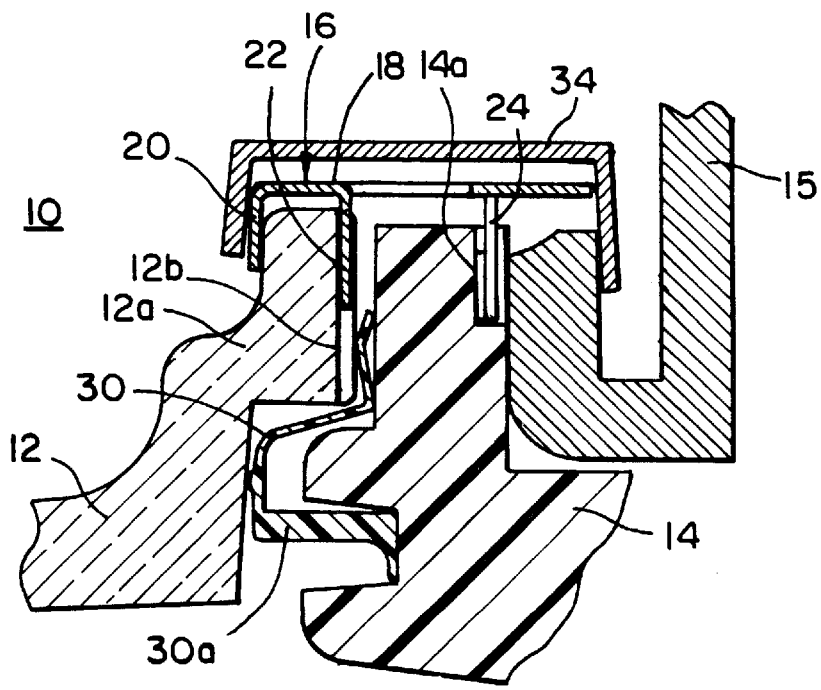
FIG. 5 is a sectional view on enlarged scale taken along lines 5—5 in FIG. 1.
Figure 2:
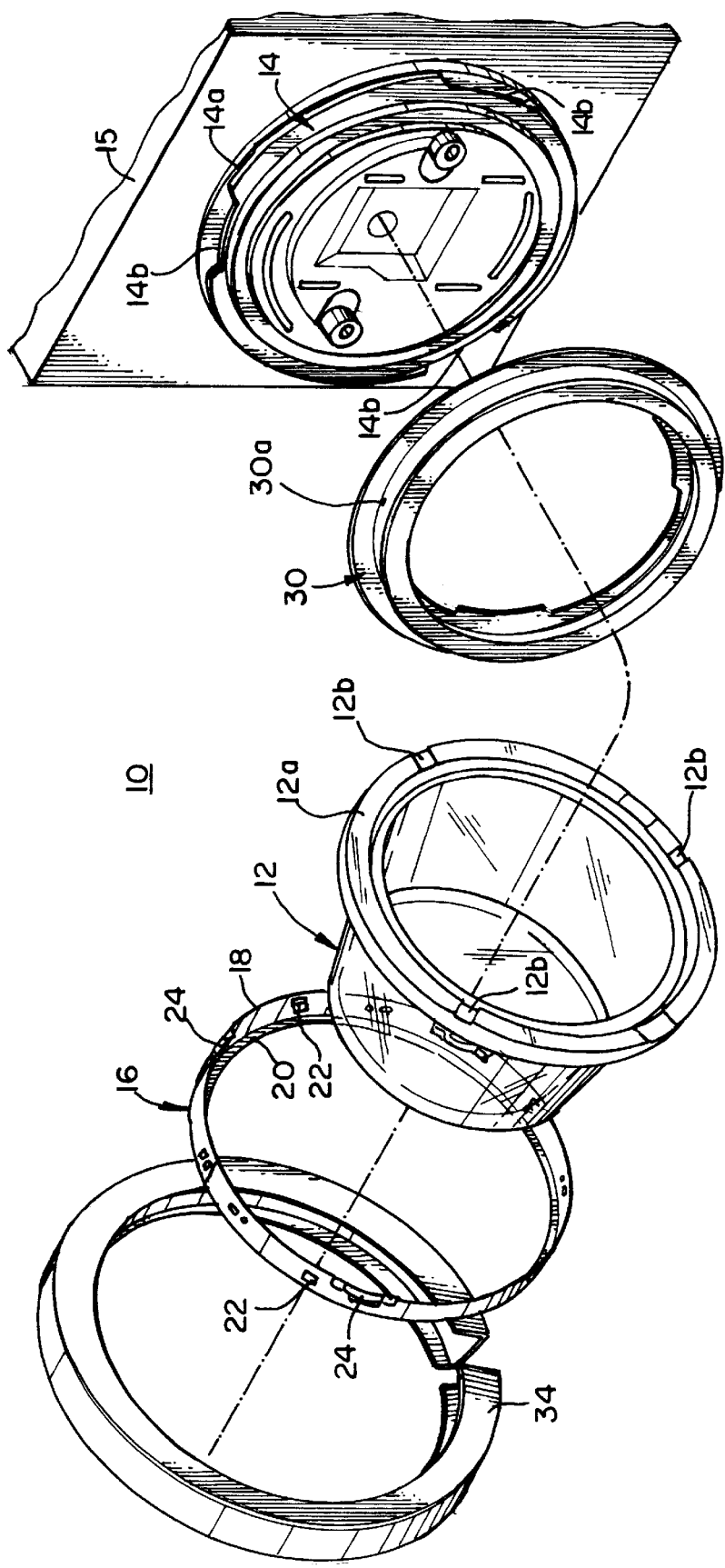
FIG. 2 is an exploded view of the electric meter assembly illustrated in FIG. 1 showing the meter cover, the meter base and stainless steel mating rim.
Figure 3:
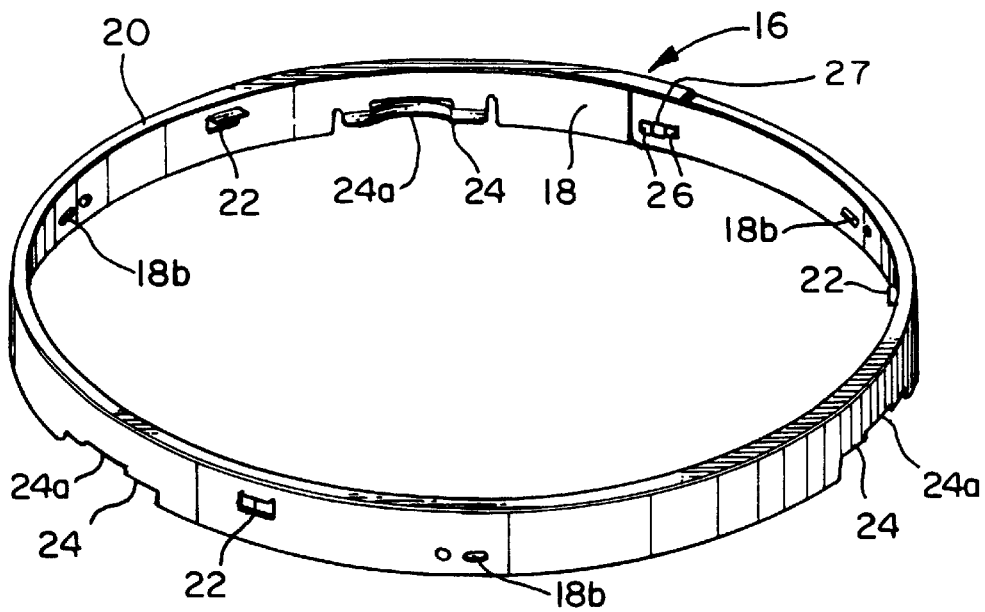
FIG. 3 is a perspective view of the stainless steel mating rim embodying the present invention.
Figure 4:
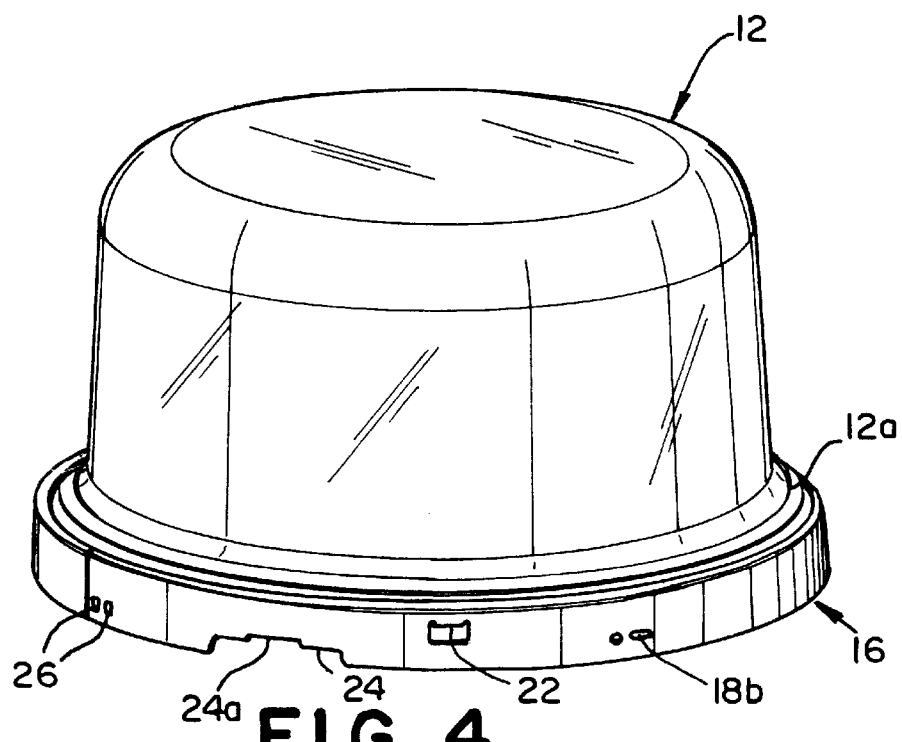
FIG. 4 is a perspective view of the stainless steel mating rim of FIG. 3 assembled on the glass/meter cover.

Referring to the drawings, FIGS. 1, 2 and 5 show an electric meter assembly 10 wherein a cup-shaped cover 12 cooperates with a base unit 14 to define an enclosure within which an electric meter (not shown) is located. A one-piece stainless steel mating rim 16, FIGS. 1 and 5 mounts the meter cover 12 onto the meter base 14 for insertion of the meter into a conventional cup-shaped mounting socket 15. The meter cover 12 includes an annular flange 12a at its open end and the meter base 14 includes a circular perimeter flange having a plurality of inclined base locking lugs 14a (preferably three) equally distributed around the adjacent areas 14b cut back from the circular perimeter of the base 14. The mating rim 16 FIGS. 2, 3, 4 and 6 is formed by cutting a strip stainless steel of predetermined width to a predetermined length corresponding to the circumference of the meter cover 12. A flange is formed on one edge of the strip 18 for mating with the annular flange 12a of the meter cover 12. A plurality of attachment tabs 22 are punched in the strip 18 at spaced locations, the attachment tabs 22 being spaced apart from the flange 20 a predetermined distance for receiving therebetween the flange of the 12a of the meter cover. The flange 12a of the cover includes a plurality of notches or recesses 12b of reduced thickness corresponding to the plurality of attachment tabs 22. The attachment tabs 22 are shaped to fit within the notches 12b, FIGS. 2, 4 and 5. Also punched from the strip 18 at a plurality of spaced locations is a plurality of locking lugs 24. The locking lugs 24 are spaced from the flange 20 a predetermined distance for receiving therebetween the flange on the meter base 14. A pair of locking tabs 26 are punched from one end of the strip 18 and an opening is punched in the opposite end of the strip 18 to receive the locking tabs 26. The plurality of attachment tabs, the plurality of locking lugs and the pair of locking tabs are all bent to the same side of the strip 18 as the flange 20. The strip 18 is then formed into a circular rim 16. The circular rim 16 is fitted around the circumference of the annular cover flange 12a with the flange 20 of the cover engaging the outer surface of the flange 12a and the attachment tabs 22 being inserted in the cover recesses 12b. Thus the annular flange 12a of the meter cover is positioned between the attachment tabs 22 and the flange 20 to attach the mating rims 16 together without the need for welding to the annular flange 12a of the meter cover 12 and prevent rotation of the mating rim 16 with respect to the meter cover 12. The ends of the rim 16 are secured together by inserting the locking tabs 26 into the opening 27 at the opposite end of the rim and mechanically securing one end of the rim to the other. The locking tabs 26 preferably are staked for securing the ends of the rim together without the need for welding, FIGS. 3 and 4.

Figure 6:
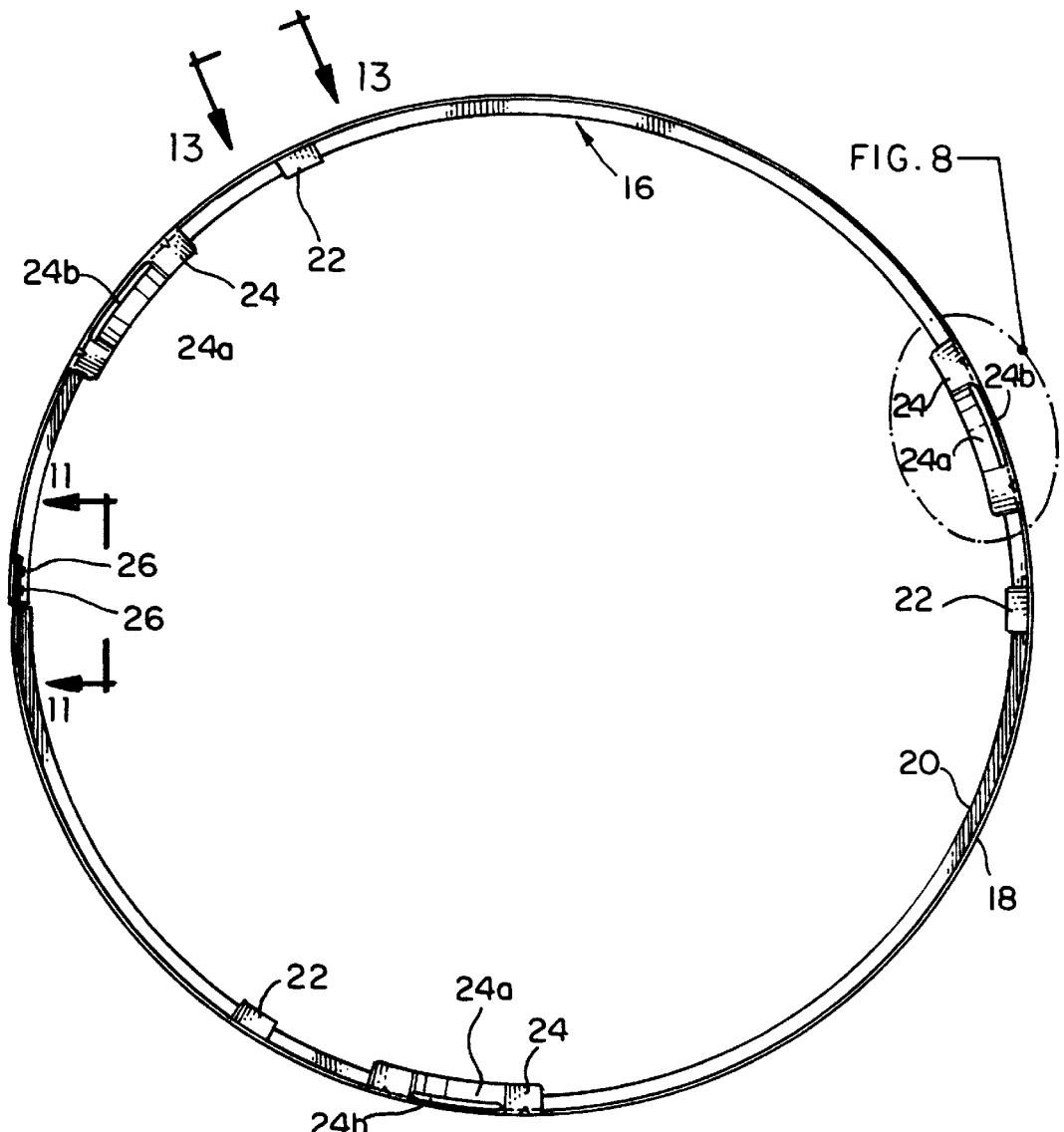
FIG. 6 is a bottom view of the stainless steel mating rim shown in FIG. 3.
Figure 7:
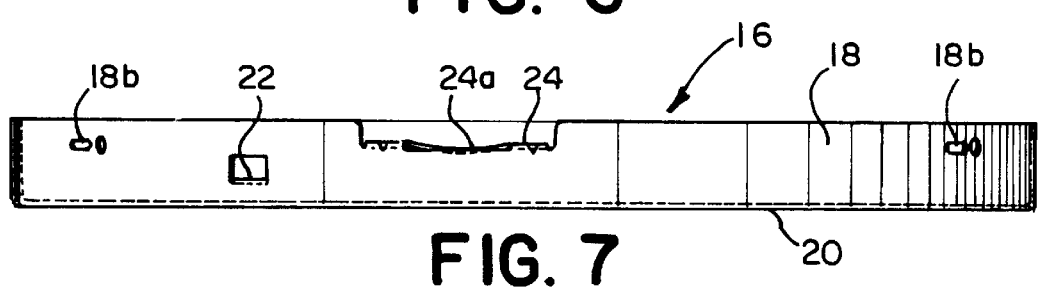
FIG. 7 is a side elevation of the stainless steel mating rim shown in FIG. 6.

The mating rim 16 is provided with base attachment means for removably attaching the mating rim 16 to the meter base 14. The base attachment means includes the plurality of rim locking lugs 24, preferably three, projecting inwardly from the strip 18 of the rim 16, FIGS. 3 and 6. Each of the rim locking lugs 24, FIG. 6 is located adjacent an attachment tab 22 spaced from the edges of the strip 18 of the rim 16. Each of the rim locking lugs 24 is shaped to extend through the respective areas 14b, FIG. 2, cut back on the circular perimeter of the base 14 to allow the rim locking lugs 24 of the mating rim 16 to fit over the perimeter of the base 14. Each of the rim locking lugs 24, FIGS. 6–10, includes a flexible section 24a including a longitudinal slot 24b and shaped to ride up the incline of the mating base locking lug 14a when the glass cover 12 with the circular mating rim 16 attached is twisted for assembly with the mating base 14. This causes the rim locking lugs 24 to bear up against the mating base locking lug 14a with increasing force as the cover 12 is turned until the top of the incline of the base locking lug is reached. The flexible section 24a of each rim locking lug 24 cooperates with the mating base locking lug 14a to maintain the contact force there between constant. The magnitude of the contact force and resulting torque twist the cover 12 onto the base 14 is dependent upon the buildup of parts making up the assembly. As may best be seen in FIG. 5, the buildup of parts includes the flange 12a of the cover 12, the ramp 14a on the flange of the base 14 and the gasket 30 that is inserted there between. The glass cover 12, the base 14 and the vertical section 30a of the gasket 30 are quite rigid and have high spring constant. To allow the maximum twisting torque for the cover to be maintained at a reasonable level, the ring locking lugs 24 include the flexible section 24a. When the buildup of parts is large, the flexible portion 24a of the lug 24 deflects so that the force is kept to a manageable level thereby limiting the torque required to overcome the frictional component of the force. The opposite is also true, i.e., when the buildup of the parts is small, the flexible ramp 24a applies at least a small force so that the cover 12 is not loose on the meter base. If the cover 12 is loose, it is possible for dust and insects to get into the meter and over into the sealing gasket. The flexible portion 24a of the locking tab 24 minimizes the range between low and high level torque required to place the cover and rim assembly 12, 16 onto the base 14.

In the prior art mating ring such as the plastic rings in the aforesaid U.S. Pat. No. 5,959,243 it was necessary to include interference pads on the inner surface of the ring to maintain the fit of the inside diameter of the plastic mating ring and the outside diameter of the cover rim within close limits. If the mating ring is too large (or the cover too small) the ring could easily be pushed off of the cover. Likewise, if the ring is too small or the cover too large, the ring either cannot be assembled onto the cover or will be extremely tight. When the stainless steel rim of the present invention, the circumference of the rim 16 is automatically controlled by fitting it to the circumference of the rim 12a of the cover 12 by means of the locking tabs 26 at one end of the rim 16 and the cooperating opening 27 for receiving these tabs at the opposite ends of the rim 16.

Upon installation of the electric meter in the field, the installer takes the meter with the cover and base assembled as described above and inserts it into a socket 15, FIG. 1, and places a split "U" shaped metal sealing ring 34 around the perimeter of the cover flange 12a, mating rim 16 and base 14. An opening 18b, FIGS. 3 and 4, in the strip 18 of the mating rim 16 is provided to allow insertion of the meter seal, not shown, through the side of the ring 18 into the base 14 to identify potential tampering of the meter.

From the foregoing it will be seen that the primary emphasis of the design of the stainless steel mating rim is to reduce the complexity of the assembly by making it from a single strip of stainless steel sheet metal. Forming the various connecting structure from the rim material reduces the cost associated with the manufacture of the rim and the assembly of the rim onto the cover. No additional components are required as attachments to the rim to make it a functional assembly and all welding is eliminated. The basic features required in a mating rim are (1) tabs for interlocking the rim to the cover (2) locking lugs to allow the rim to be tightened onto the base and (3) a means of securely attaching one end of the rim to the other. These structural features are punched out from the rim material itself and are an integral part of it. All of these structural elements are bent radially inward from punched and lanced sections in the rim. Since all of the structural elements are die punched and bent sections, a high degree of dimensional accuracy is maintained between the elements. All of the elements on the periphery of the rim are precisely located relative one to the other. When the rim is attached to the cover, the overall length of the rim controls the diameter of the rim. Variations in the diameter of the rim are greatly minimized and the fit between the rim and the cover is closely controlled. A simple process of upsetting the staking tabs is only required for completing the attachment. No welding is required.

From the foregoing it will be seen that the present invention provides a stainless steel mating rim for assembling a meter cover onto a base with a sealing gasket in place. The mating rim being made of stainless steel is of sufficient strength to avoid being broken and unlike plastic does not deteriorate with time and under adverse conditions. The stainless steel mating rim has integral therewith the various attachment tabs, locking lugs and locking tabs for attaching the rim to the cover, locking the rim to the base and insuring a proper fit of the rim with the cover.

While there has been described a preferred embodiment of the invention, it will be understood that further modifications may be made without departing from the spirit and scope of the invention as set forth in the appended claims.

What is claimed is:

1. A method of making a one-piece stainless steel rim for mating a meter cover and base comprising the steps of:

cutting a strip of stainless steel of predetermined width to a predetermined length corresponding to the circumference of the meter cover, forming a flange on one edge of the strip, punching a plurality of attachment tabs in said strip at spaced locations, said attachment tabs being spaced apart from said flange to receive therebetween an annular flange on the meter cover, punching a plurality of locking lugs in said strip at spaced locations, said locking lugs being spaced apart from said flange to receive therebetween an annular flange on the meter base, punching a pair of locking tabs at one end of said strip, punching an opening in the opposite end of said strip to receive said locking tabs, bending said plurality of attachment tabs, said plurality of locking lugs and said pair of locking tabs to the same side of said strip as said flange, forming said strip into a circular rim, and securing the ends of the rim together by inserting the locking tabs into the opening at the opposite end of the rim and mechanically securing one end of the rim to the other after the rim is fitted around a circumference of the annular flange of the meter cover.

2. A method of making a one-piece stainless steel rim according to claim 1 wherein said ends of said rim are mechanically secured to each other by staking said locking tabs.

3. A method of making a one-piece stainless steel rim according to claim 1 wherein said plurality of locking lugs for attachment of said rim to said base include a flexible center section.

4. A one-piece stainless steel rim for mating a meter cover and base comprising a strip of stainless steel of predetermined width cut to a predetermined length corresponding to the circumference of the meter cover, a flange formed on one edge of the strip, a plurality of attachment tabs punched in said strip at spaced locations, said attachment tabs being spaced apart from said flange to receive therebetween an annular flange on the meter cover, a plurality of locking lugs punched in said strip at spaced locations, said locking lugs being spaced apart from said flange to receive therebetween an annular flange on the meter base, a pair of locking tabs punched in said strip at one end thereof, an opening punched in the opposite end of said strip to receive said locking tabs, said plurality of attachment tabs, said plurality of locking lugs and said pair of locking tabs being bent to the same side of said strip as said flange, said strip being formed into a circular rim, and the ends of the rim being adapted to be secured together by inserting the locking tabs into the opening at the opposite end of the rim after the rim is fitted around a circumference of the annular flange of the meter cover.

5. A one-piece stainless steel rim according to claim 4 wherein said ends of said rim are mechanically secured to each other by staking said locking tabs.

6. A one-piece stainless steel rim according to claim 4 wherein said plurality of locking lugs for attachment of said rim to said base include a flexible center section.

* * * * *